US006972836B2

(12) United States Patent
Sato et al.

(10) Patent No.: US 6,972,836 B2
(45) Date of Patent: Dec. 6, 2005

(54) MEASURING METHOD OF ILLUMINANCE UNEVENNESS OF EXPOSURE APPARATUS, CORRECTING METHOD OF ILLUMINANCE UNEVENNESS, MANUFACTURING METHOD OF SEMICONDUCTOR DEVICE, AND EXPOSURE APPARATUS

(75) Inventors: Kazuya Sato, Tokyo (JP); Soichi Inoue, Yokohama (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 506 days.

(21) Appl. No.: 10/131,083

(22) Filed: Apr. 25, 2002

(65) Prior Publication Data

US 2002/0159049 A1      Oct. 31, 2002

(30) Foreign Application Priority Data

Apr. 27, 2001    (JP)    ............................. 2001-133298

(51) Int. Cl.⁷ .............................................. G01J 1/00
(52) U.S. Cl. ........................................ 356/121; 355/53
(58) Field of Search ............................... 356/121–123, 356/399–401; 355/43, 45, 55, 77, 67–71; 250/548

(56) References Cited

U.S. PATENT DOCUMENTS

| | | | | |
|---|---|---|---|---|
| 5,067,811 A | * | 11/1991 | Ouchi ......................... | 356/121 |
| 5,160,962 A | * | 11/1992 | Miura et al. ................. | 355/53 |
| 5,633,713 A | * | 5/1997 | Tanaka et al. .............. | 356/521 |
| 5,677,754 A | * | 10/1997 | Makinouchi ................ | 355/53 |
| 5,717,483 A | * | 2/1998 | Kikuchi ....................... | 355/69 |
| 5,894,341 A | * | 4/1999 | Nishi et al. .................. | 355/68 |
| 5,973,771 A | | 10/1999 | Hibbs et al. ................ | 356/121 |
| 6,048,651 A | | 4/2000 | Brunner et al. ............. | 430/5 |
| 6,127,095 A | * | 10/2000 | Kudo ........................... | 430/311 |
| 6,285,442 B1 | * | 9/2001 | Sato ............................. | 355/67 |
| 6,317,198 B1 | | 11/2001 | Sato et al. ................... | 355/77 |
| 6,771,350 B2 | * | 8/2004 | Nishinaga .................... | 355/53 |

FOREIGN PATENT DOCUMENTS

| | | |
|---|---|---|
| JP | 7-192995 | 7/1995 |
| JP | 2001-230179 | 8/2001 |
| WO | 2002/031570 A1 | 4/2002 |

OTHER PUBLICATIONS

K. Sato et al., "Measurement of Effective Source Shift Using a Grating-Pinhole Mask", SPIE Conference on Optical Microlithography XII, vol. 3679, pp. 99-107, (Mar. 1999).
J.P. Kirk et al., "Pupil Illumunation; in Situ Measurement of Partial Coherence", SPIE vol. 3334, pp. 281-288, (Feb. 1998).

(Continued)

*Primary Examiner*—Hoa Q. Pham
(74) *Attorney, Agent, or Firm*—Finnegan, Henderson, Farabow, Garrett & Dunner, L.L.P.

(57) ABSTRACT

There is disclosed a measuring method of illuminance unevenness of an exposure apparatus in which the illuminance unevenness resulting from a projection optical system, to project the light passed through the photomask onto the finite area on the photosensitive substrate via the projection optical system and to expose the photomask to the light, the method comprising calculating an average value of transmittance of the projection optical system of each path of the light emitted from one point of the photomask and reaching an imaging point for each of a plurality of imaging points in the finite area on the photosensitive substrate, and calculating the illuminance unevenness in the finite area on the photosensitive substrate from the average value of the transmittance obtained for each imaging point.

20 Claims, 10 Drawing Sheets

OTHER PUBLICATIONS

J. Kirk et al., "Pinholes and Pupil Fills", Microlithography World, pp. 25-34, (Autumn 1997).

K. Sato et al., "Measurement of Transmittance Variation of Projection Lenses Depending on the Light Paths Using a Grating-Pinhole Mask", Optical Microlithography, Proceedings of SPIE, vol. 4346, pp. 379-386, (Feb. 2001).

K. Sato et al., "Method for Inspecting Exposure Apparatus", pending U.S. Appl. No. 09/783,295, filed Feb. 15, 2001.

* cited by examiner

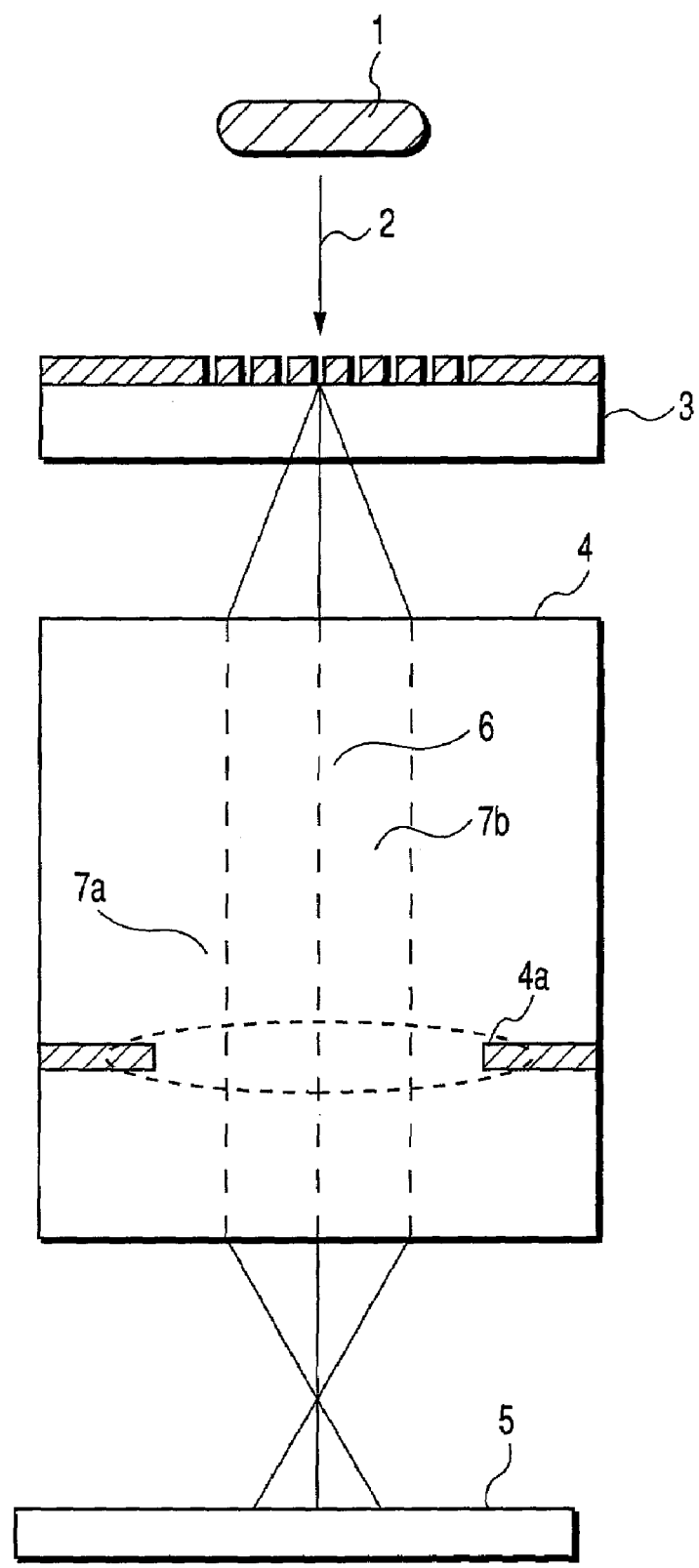
F I G. 7

| | | | | |
|---|---|---|---|---|
| 0.91 | 0.92 | 0.93 | 0.92 | 0.92 |
| 0.9 | 0.91 | 0.95 | 0.95 | 0.93 |
| 0.91 | 0.93 | 0.94 | 0.92 | 0.91 |

| | | | | |
|---|---|---|---|---|
| 0.99 | 0.98 | 0.97 | 0.98 | 0.98 |
| 1.00 | 0.99 | 0.95 | 0.95 | 0.97 |
| 0.99 | 0.97 | 0.96 | 0.98 | 0.99 |

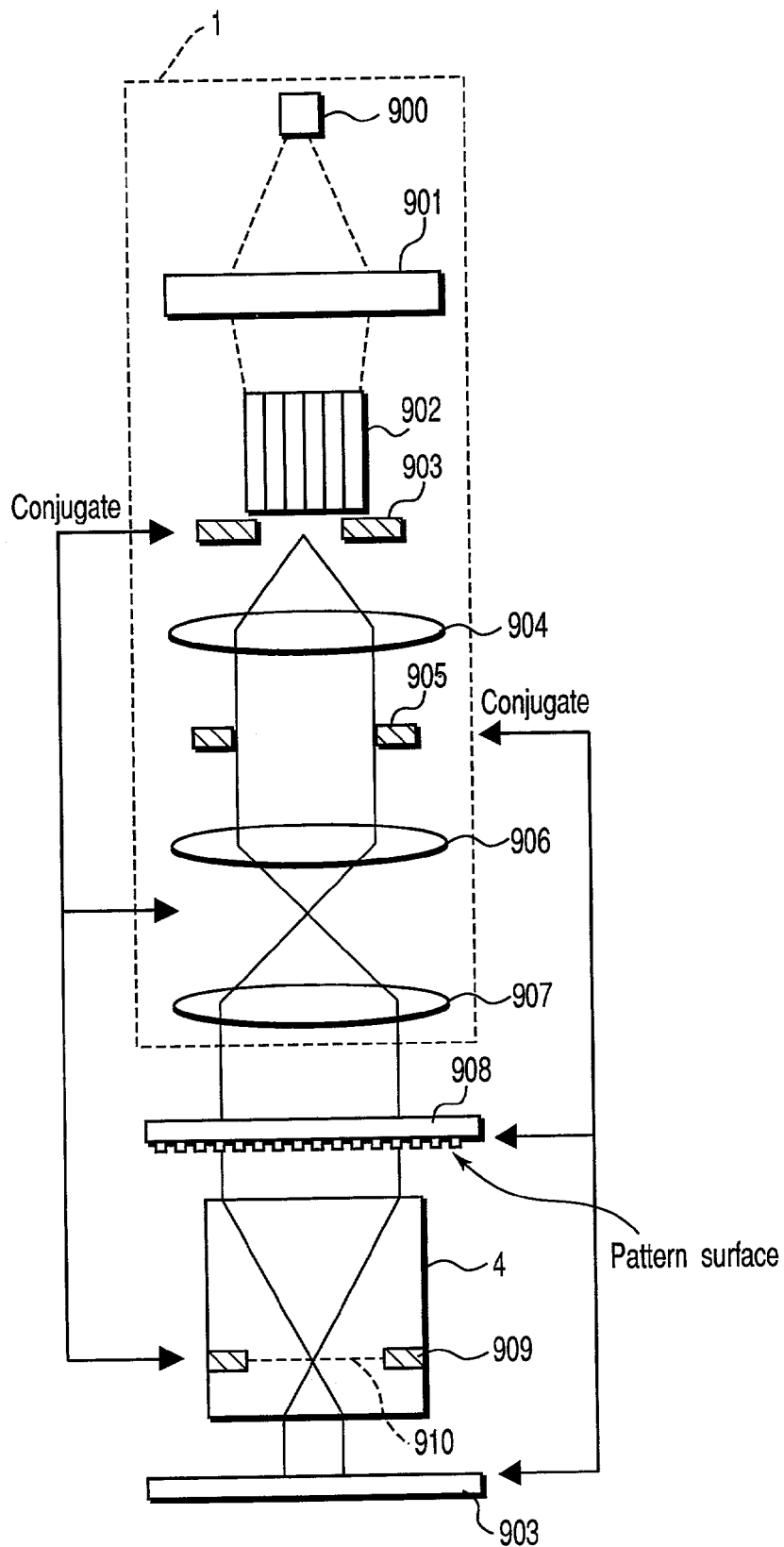
F I G. 10

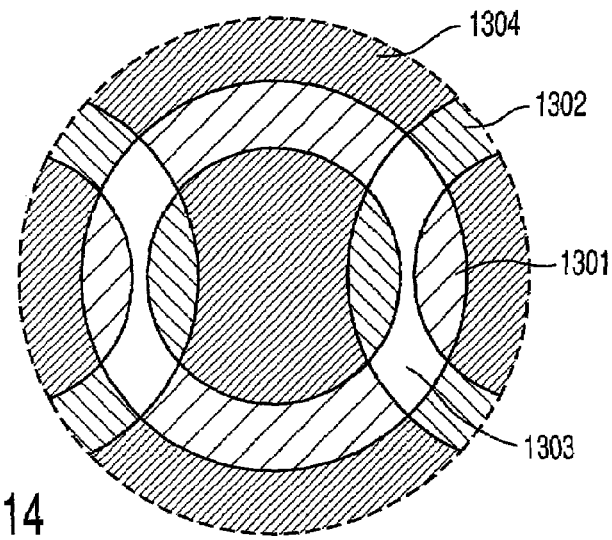
F I G. 14
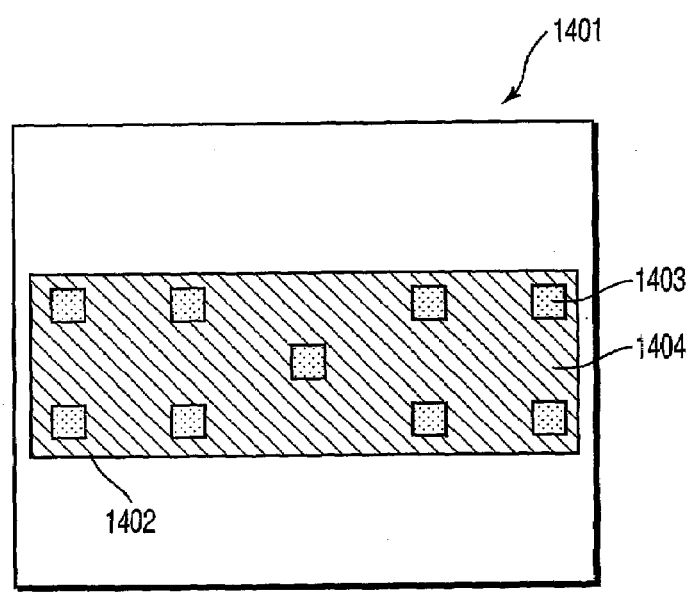
F I G. 15A
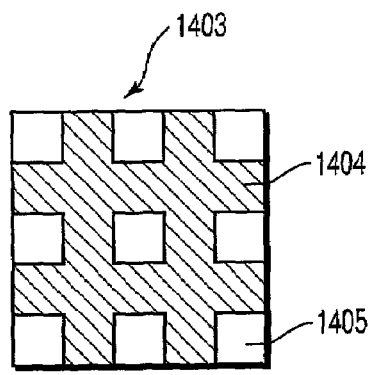
F I G. 15B

MEASURING METHOD OF ILLUMINANCE UNEVENNESS OF EXPOSURE APPARATUS, CORRECTING METHOD OF ILLUMINANCE UNEVENNESS, MANUFACTURING METHOD OF SEMICONDUCTOR DEVICE, AND EXPOSURE APPARATUS

CROSS-REFERENCE TO RELATED APPLICATIONS

This application is based upon and claims the benefit of priority from the prior Japanese Patent Application No. 2001-133298, filed Apr. 27, 2001, the entire contents of which are incorporated herein by reference.

BACKGROUND OF THE INVENTION

1. Field of the Invention

The present invention relates to an optical lithography technique for use in a manufacturing process of a semiconductor device, particularly to a measuring method of an illuminance unevenness in an exposure field of an exposure apparatus, a correcting method of the illuminance unevenness, a manufacturing method of a semiconductor device, and an exposure apparatus.

2. Description of the Related Art

A optical lithography technique is generally used in manufacturing a circuit pattern of a semiconductor device. In a projection exposure apparatus for use in a optical lithography process, a light emitted from an illuminating optical system is incident upon a photomask (reticle) in which a circuit pattern is drawn. Moreover, the light passed through the photomask is collected by the projection optical system. Furthermore, in general, the circuit pattern of the semiconductor device is formed/projected in an image on a photosensitive substrate, such as a silicon wafer coated with a photoresist.

In general, in the exposure apparatus for use in the semiconductor device process, a partial coherent imaging system transfers the image. The partial coherent imaging system indicates a state in which a numerical aperture of an illuminating optical system for irradiating the photomask with the light is larger than 0, and smaller than a numerical aperture of the projection optical system for projecting the light image passed through the photomask with respect to the surface of the photosensitive substrate. That is, the exposure apparatus irradiates the photomask with a light from a two-dimensional light source having a certain area, collects the light transmitted through the photomask onto the substrate via the projection optical system, and forms/projects the pattern of the photomask surface in the image on the substrate surface.

The photoresist is exposed to the light having an appropriate light intensity and, as a result, an appropriate resist pattern is formed onto the substrate. When light exposure is excessively high or low, the appropriate transfer is not realized. In general, a finite area in which a batch-transferred image exists, that is, a exposure field has a longitudinal/lateral size of several millimeters to several tens of millimeters. The illuminance of the light in the exposure field needs to be even. When the pattern becomes finer, a tolerance concerning a fluctuation of light exposure for transferring a proper image becomes narrow, and the illuminance needs to be even with a high precision.

In an actual exposure apparatus, there is possibility that the illuminance in the exposure field changes for reasons such a untireflection coatings of a lens constituting the projection optical system. To suppress the illuminance unevenness, methods are applied such as a method of moving the lens along an optical axis direction, and a method of disposing a filter for correcting an illuminance distribution in a certain surface in the optical system. As an assumption for such correction, it is necessary to accurately measure the actually generated illuminance distribution.

A conventional measuring method of the illuminance unevenness in the exposure field of the exposure apparatus includes: irradiating a photomask surface having no pattern with the light; measuring the distribution of the illuminance in the substrate surface in the exposure field; and correcting the illuminance based on the result. For example, in Jpn. Pat. Appln. KOKAI Publication No. 1995-192995, the measuring method of the illuminance unevenness in the exposure field in a scan type exposure apparatus is described. The light with which the substrate surface is irradiated is received by a light receiving element, and the illuminance is measured in a plurality of points in the exposure field so that the illuminance unevenness is measured.

However, even with the correction of the illuminance unevenness using illuminance unevenness data measured by the above-described measuring method, there is a problem the illuminance unevenness is generated in the exposure field during the exposing/transferring of the fine device pattern. As described above, the exposure apparatus has the partial coherent imaging system. Therefore, when the photomask surface having no pattern is exposed, the exposure light is passed only through a path close to the optical axis in the projection optical system, in other words, in the vicinity of the middle of the pupil plane. That is, in the conventional measurement of the illuminance unevenness, transmittance of a area apart from the optical axis of the projection optical system, that is, the path of the light passed through the vicinity of the edge of the pupil plane is not considered. On the other hand, a diffracted light passed through the vicinity of the edge of the pupil plane is used in the projection/exposure of the fine semiconductor device pattern. In general, the light emitted from the photomask is passed through various paths in the projection optical system constituted of a plurality of lenses, and collected on the photosensitive substrate. A length of the light passed through a lens material or an incidence angle onto a lens surface differs with the path. When the light is reflected or scattered, the intensity of the exposure light is reduced. However, the reflecting or the scattering depends on the lens material pass length or the incidence angle onto the lens surface. Therefore, light attenuation differs depending on the light path. In other words, the transmittance of the projection optical system differs depending on the light path. Particularly, a lens thickness differs with the center and edge of the pupil plane, or the incidence angle of the light incident upon the lens surface differs, and therefore there is possibility that the transmittance largely differs between the light path extending in the vicinity of the middle of the pupil plane of the projection optical system and the light path in the vicinity of the edge of the pupil plane. Therefore, if a fine semiconductor device pattern is formed/projected in the image in a certain point on the photosensitive substrate, and when the transmittance of the path of the diffracted light passed in the vicinity of the edge of the pupil plane fluctuates, the intensity of the exposure light transferred onto the imaging point fluctuates with respect to the exposure light intensity of another imaging point. However, since the transmittance of the path passed through the vicinity of the edge of the pupil plane is not considered in the above-described illuminance unevenness measuring method, it is impossible to obtain a correction value of the illuminance unevenness appropriate for the fine pattern transfer. Because of such illuminance unevenness, it is difficult to normally form the fine semiconductor device pattern, and there is possibility that a yield of the semiconductor device is small.

BRIEF SUMMARY OF THE INVENTION

According to an aspect of the present invention, there is provided a measuring method of an illuminance unevenness of an exposure apparatus in which the illuminance unevenness generated in a finite area on a photosensitive substrate is measured with respect to the exposure apparatus to irradiate a photomask with an illumination light emitted from an illuminating optical system, to project the light passed through the photomask onto the finite area on the photosensitive substrate via the projection optical system to expose the photomask to the light, the method comprising: measuring a transmittance of said projection optical system of the light emitted from one point, which is optically conjugate with an imaging point, on said photomask, traveling inside said projection optical system and reaching said imaging point for each of a plurality of imaging points in the finite area on said photosensitive substrate; calculating an average value of the transmittance of the light emitted from said one point, traveling inside said projection optical system and converging on said imaging point about a plurality of paths inside said projection optical system for each of a plurality of imaging points in the finite area on said photosensitive substrate; and calculating the illuminance unevenness in the finite area on said photosensitive substrate from a distribution of said average values of the transmittance obtained for said each imaging point.

According to another aspect of the present invention, there is provided a measuring method of an illuminance unevenness of an exposure apparatus in which the illuminance unevenness generated in a finite area on a photosensitive substrate is measured in the exposure apparatus to irradiate a photomask having a light transmission pattern formed thereon with an illumination light emitted from an illuminating optical system, to project the light passed through the photomask via a projection optical system, and to transfer a pattern analogous to said light transmission pattern onto the finite area on the photosensitive substrate, said method comprising: disposing a plurality of diffraction patterns having a uniform periodicity in a predetermined area in said photomask; disposing an illuminance measuring mechanism to measure illuminance of an optional point on the surface of said photosensitive substrate; irradiating said diffraction pattern with the light from said illuminating optical system; using said illuminance measuring mechanism to measure the illuminance in a position of an image formed by said diffraction pattern in said photosensitive substrate surface; and calculating an illuminance distribution in the finite area of said photosensitive substrate in a form related to both a position of an optical imaging point and incidence direction of the light.

According to another aspect of the present invention, there is provided a correcting method of an illuminance unevenness of an exposure apparatus in which the illuminance unevenness generated in a finite area on a photosensitive substrate is corrected with respect to the exposure apparatus to irradiate a photomask with an illumination light emitted from an illuminating optical system, to project the light passed through the photomask onto the finite area on the photosensitive substrate via the projection optical system and to expose the photomask to the light, said method comprising: measuring a transmittance of said projection optical system of the light emitted from one point, which is optically conjugate with an imaging point, on said photomask, traveling inside said projection optical system and reaching said imaging point for each of a plurality of imaging points in the finite area on said photosensitive substrate; calculating an average value of the transmittance of the light emitted from said one point, traveling inside said projection optical system and converging on said imaging point about a plurality of paths inside said projection optical system for each of a plurality of imaging points in the finite area on said photosensitive substrate; calculating the illuminance unevenness in the finite area on said photosensitive substrate from a distribution of said average values of the transmittance obtained for said each imaging point; and correcting the illuminance unevenness based on the illuminance unevenness in the finite area of said photosensitive substrate.

According to another aspect of the present invention, there is provided a correcting method of an illuminance unevenness of an exposure apparatus in which the illuminance unevenness generated in a finite area on a photosensitive substrate is corrected in the exposure apparatus to irradiate a photomask having a light transmission pattern formed thereon with an illumination light emitted from an illuminating optical system, to project the light passed through the photomask via a projection optical system, and to transfer a pattern analogous to said light transmission pattern onto the finite area on the photosensitive substrate, the method comprising: disposing a plurality of diffraction patterns having a uniform periodicity in a predetermined area in said photomask; disposing an illuminance measuring mechanism to measure illuminance of an optional point on the surface of said photosensitive substrate; irradiating said diffraction pattern with the light from said illuminating optical system, and using said illuminance measuring mechanism to measure the illuminance in a position of an image formed by said diffraction pattern in said photosensitive substrate surface; calculating an illuminance distribution in the finite area of said photosensitive substrate in a form related to both a position of an optical imaging point and incidence direction of the light; and correcting the illuminance unevenness based on the illuminance unevenness in the finite area of said photosensitive substrate.

BRIEF DESCRIPTION OF THE SEVERAL VIEWS OF THE DRAWING

FIG. 7 is a diagram showing the whole constitution of the exposure apparatus as the measurement object according to the first embodiment.

FIG. 10 is a diagram showing the schematic constitution of the exposure apparatus that has a correction filter.

FIG. 14 is a diagram showing dependence of the intensity of the diffracted light on a path as a contour map on the pupil plane.

FIGS. 15A and 15B are diagrams showing a schematic configuration of the photomask according to a third embodiment.

DETAILED DESCRIPTION OF THE INVENTION

Embodiments of the present invention will be described hereinafter with reference to the drawings.

(First Embodiment)

Figure 1:
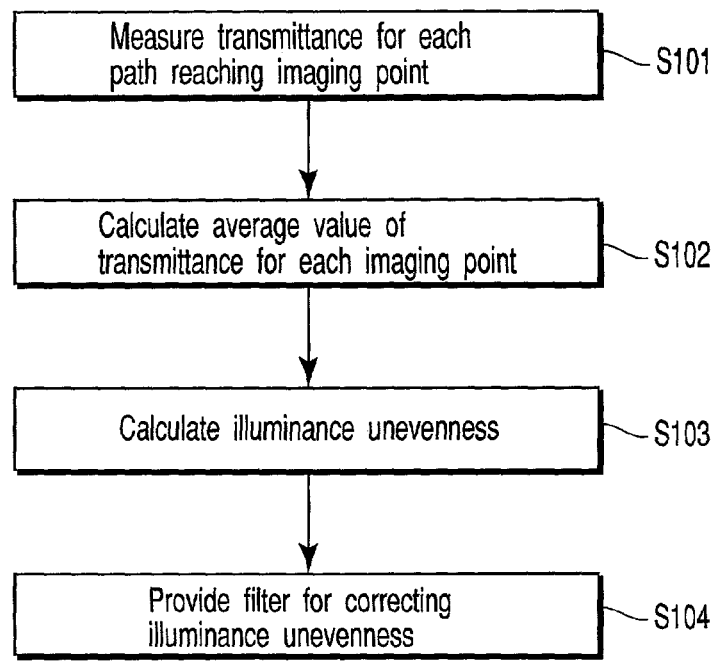
FIG. 1 is a flowchart showing an illuminance unevenness correcting method according to a first embodiment.

FIG. 1 is a flowchart showing an illuminance unevenness correcting method according to a first embodiment of the present invention.

(Step S101)

First, a transmittance distribution depending on a path of a projection optical system of an exposure apparatus is obtained.

In an illuminance unevenness measuring method according to the first embodiment, a method of measuring a projection lens transmittance dependent on the path is used, which is disclosed by the present inventor in Jpn. Pat. Appln. No. 2000-36690 (Jpn. Pat. Appln. KOKAI Publication No. 2001-230179, U.S. application Ser. No. 09/783,295), the entire contents of which are incorporated herein by reference. The transmittance measuring method of a projection lens system dependent on the path of the light passed, described in the Jpn. Pat. Appln. No. 2000-36690, will be described hereinafter.

Figure 2:
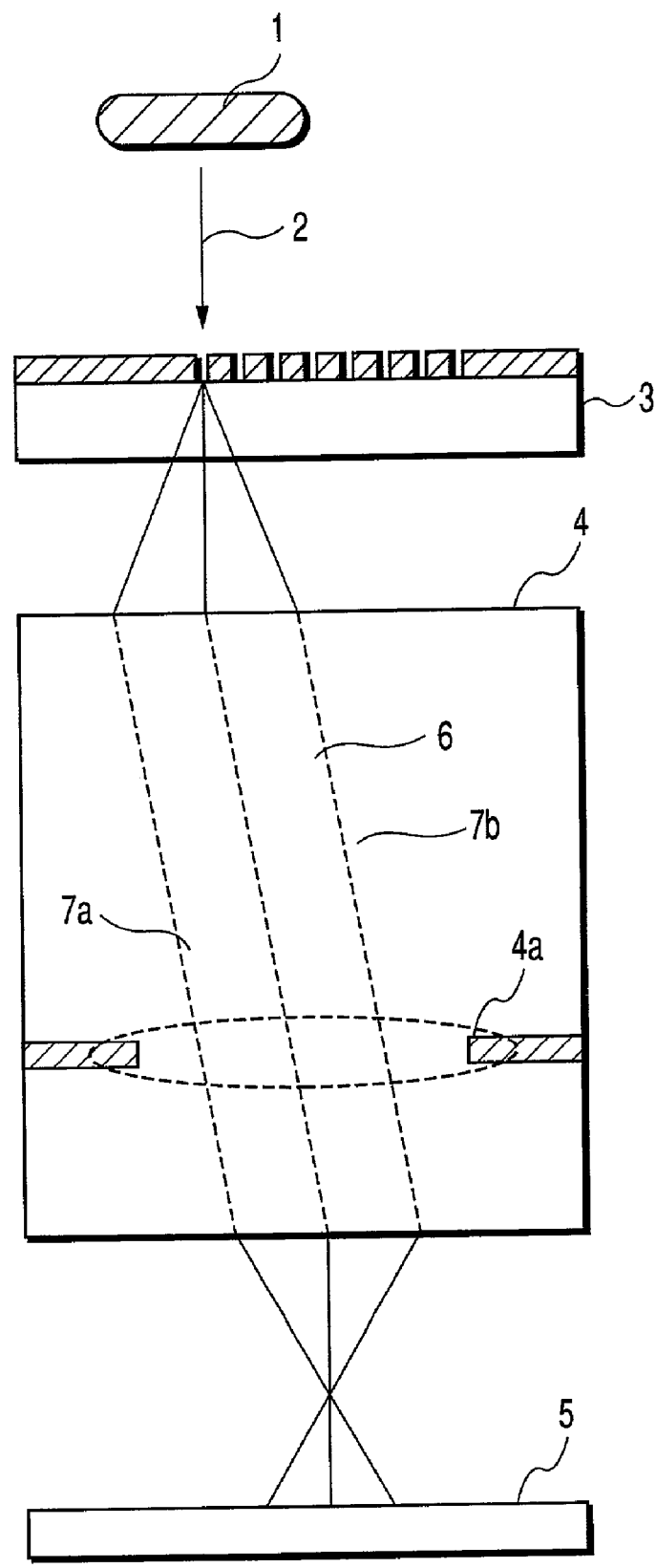
FIG. 2 is a diagram showing a whole constitution of an exposure apparatus as an object of a measurement according to the first embodiment.

FIG. 2 is a diagram showing a whole constitution of the exposure apparatus as an object of a measurement according to the first embodiment of the present invention. In the first embodiment, an example in which a KrF excimer laser reduction projection exposure apparatus ($\lambda$=248 nm, NA=0.6, $\sigma$=0.3, M=4) is checked will be described. Here, $\lambda$ denotes an exposure wavelength, NA denotes a numerical aperture on a wafer side of the projection optical system, $\sigma$ denotes a coherence factor of the exposure apparatus, and M denotes a magnification of a photomask.

As shown in FIG. 2, along a light path of an exposure light 2, an illuminating optical system 1, photomask 3, projection optical system 4, and wafer 5 are successively arranged to constitute the exposure apparatus.

Figures 3A, 3B:
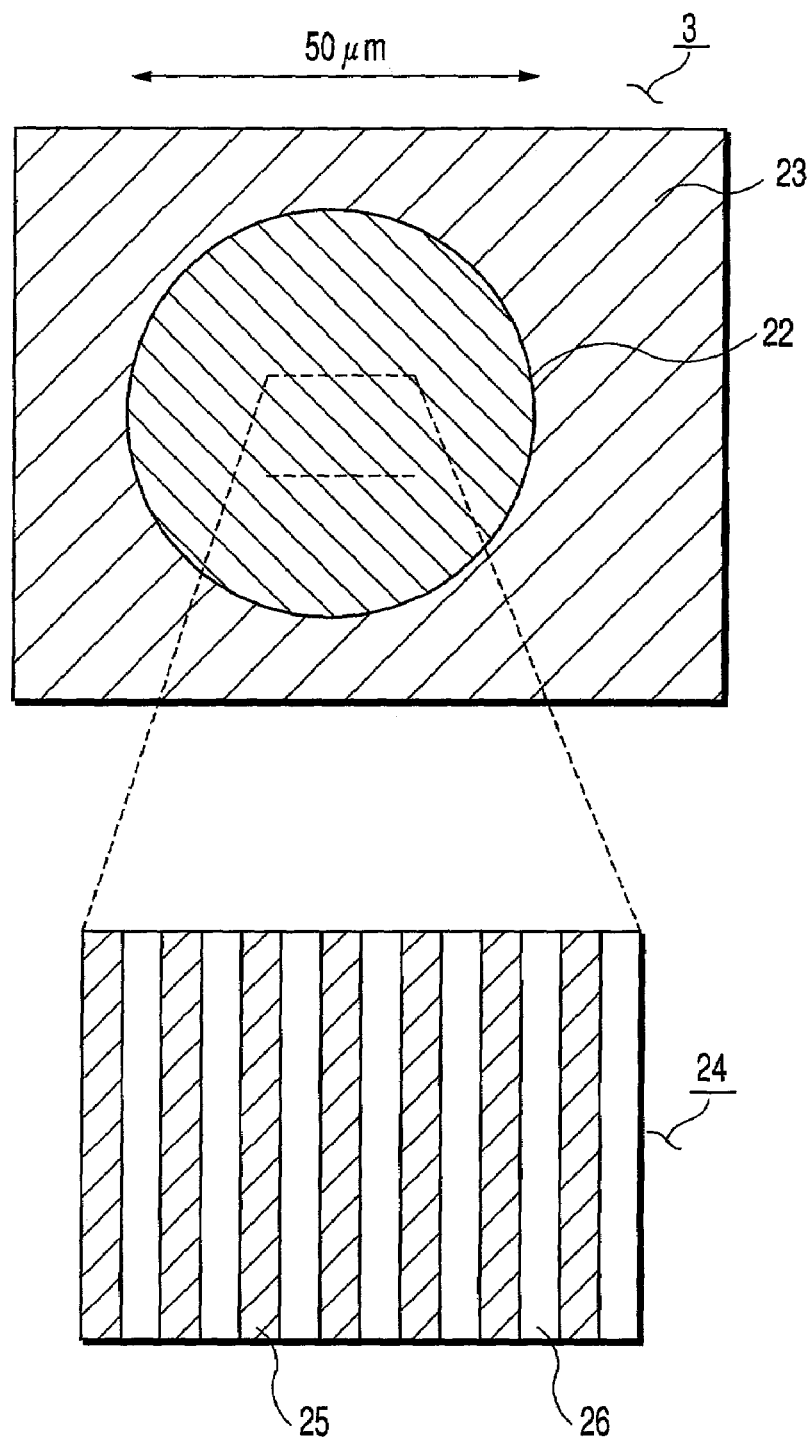
FIGS. 3A and 3B are diagrams showing a photomask installed in the exposure apparatus shown in FIG. 2.

FIGS. 3A and 3B are diagrams showing the photomask 3 for the check installed in the above-described exposure apparatus. As shown in the whole constitution plan view of FIG. 3A, a grating pinhole pattern 22 is disposed as a light transmission pattern in a pattern surface of the photomask 3. Moreover, a shield area 23 is disposed around the grating pinhole pattern 22. The grating pinhole pattern 22 has a diameter of 50 $\mu$m (scale on the photomask).

FIG. 3B is an enlarged view of a part of the grating pinhole pattern 22 of the photomask 3. As shown in FIG. 3B, a diffraction pattern 24 constituted of a line & space pattern in which opaque portions 25 and transmission portions 26 are periodically formed is formed in the grating pinhole pattern 22 of the photomask 3.

As shown in FIG. 2, the photomask 3 is disposed in such a manner that the surface with the pattern formed thereon is disposed on the illuminating optical system 1 side, and the pattern is exposed. Additionally, for usual pattern exposure, the mask is disposed in such a manner that the actual pattern formed surface is disposed on the wafer 5 side. In the first embodiment, the photomask 3 is mounted on a mask stage so as to reverse the actual pattern exposure, so that the wafer 5 and the pattern surface of the photomask 3 can be unconjugated. Additionally, the wafer 5 is coated with a photoresist (not shown).

Since the photomask pattern surface and wafer surface are unconjugated, the line and space pattern is not transferred onto the wafer surface. Instead, diffracted lights generated in the line and space pattern reach separate positions, and the resist pattern is formed. The photomask 3 is a binary mask constituted only of the opaque portions and transmission portions. Therefore, +1st-order diffracted light and −1st-order diffracted light are generated with the same intensity.

Additionally, a pitch p of the diffraction pattern 24 is set so as to satisfy p>M$\lambda$/NA(1+$\sigma$). Thereby, a 0th-order diffracted light and 1st-order diffracted light are transferred in positions apart from each other. In this state, the image of the ±1st-order diffracted light can be measured as described later without being disturbed by the image of the 0th-order diffracted light, and this is advantageous.

In the first embodiment, it is assumed that the pitch of the line and space pattern is 1.6 $\mu$m (scale on the photomask), and a ratio of the width of the opaque portion 25 to the width of the transmission portion 26 is 1:1.

Figure 4:
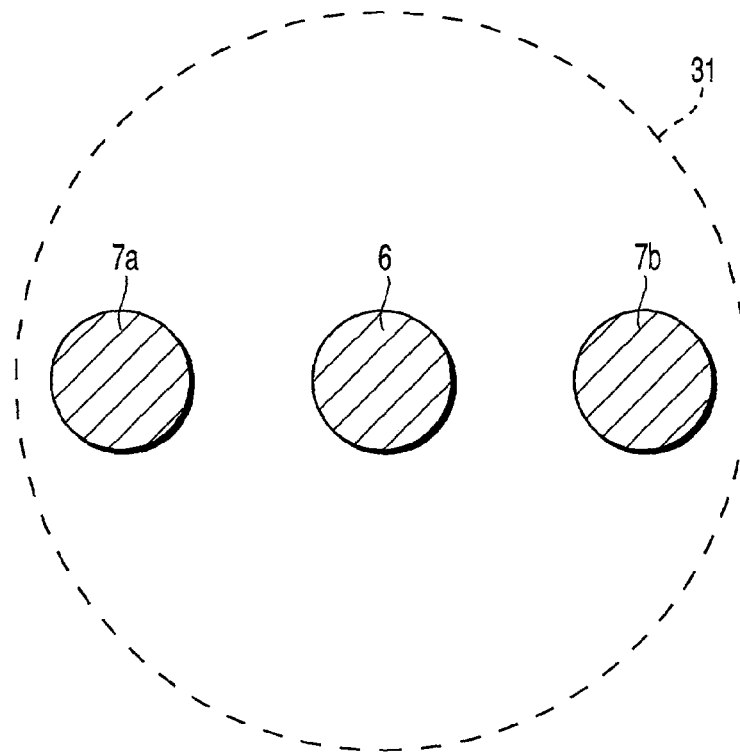
FIG. 4 is a plan view schematically showing a diffracted light passed through a pupil plane.

FIG. 4 is a plan view schematically showing the diffracted light passed through the pupil plane. As shown in FIG. 4, a 0th-order diffracted light 6, +1st-order diffracted light 7a and −1st-order diffracted light 7b are passed through the pupil plane. Additionally, in FIG. 4, reference numeral 31 denotes the edge of the pupil plane.

Figure 5:
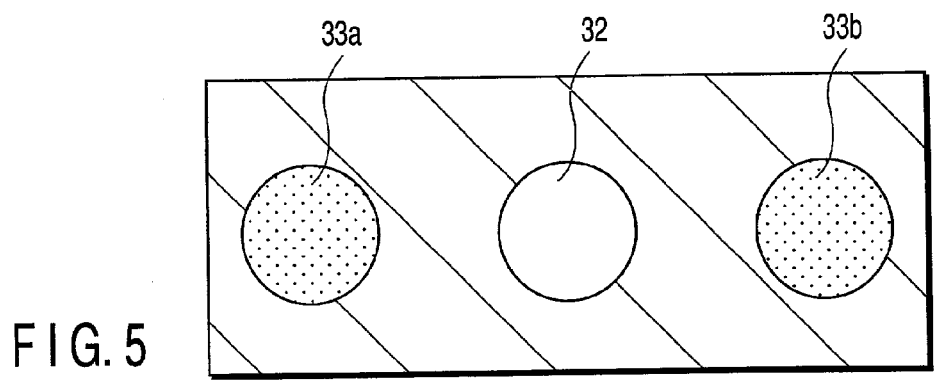
FIG. 5 is a plan view schematically showing a resist pattern obtained by a transfer of a pattern in the pupil plane.

FIG. 5 is a plan view schematically showing the resist pattern obtained by transfer of a pattern in the pupil plane. As described above, since the respective diffracted lights are radiated in respective different positions in the wafer surface. As a result, as shown in FIG. 5, a 0th-order diffracted light pattern 32, +1st-order diffracted light pattern 33a, and −1st-order diffracted light pattern 33b are formed in a resist. The respective diffracted light patterns 32, 33a and 33b are analogous to a luminance distribution of a two-dimensional light source surface formed in the illuminating optical system 1 of the exposure apparatus, and have sizes in which the value of the coherence factor a indicating a size of illumination is reflected.

The 0th-order diffracted light 6, +1st-order diffracted light 7a, and −1st-order diffracted light 7b pass onto the wafer 5 through separate paths, and the photoresist on the wafer surface is exposed. Therefore, intensities of the respective +1st-order and −1st-order diffracted lights are obtained from the exposure received the photoresist. Concretely, the light exposure is changed, the photoresist is exposed, and the pattern is formed. A minimum light exposure at which the resist of the noted position is completely eliminated is found as the photosensitive exposure from the result, a ratio of reciprocal numbers of these values is obtained, and a ratio of transmittance of the path through which the +1st-order/−1st-order diffracted light passes is obtained.

Figure 6A:
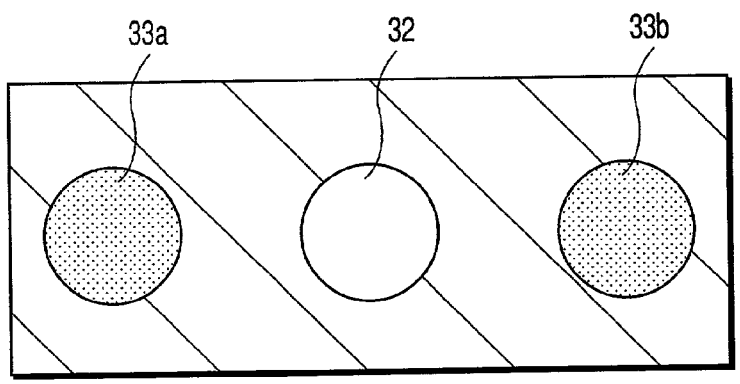
FIGS. 6A to 6C are plan views showing resist patterns obtained when light exposure is changed and a photoresist film is exposed.
Figure 6B:
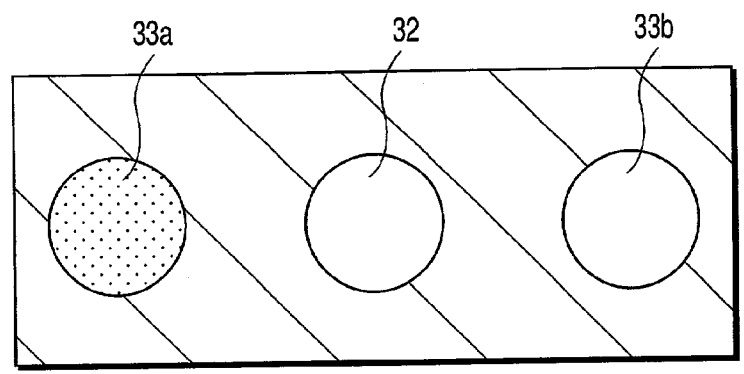
Figure 6C:
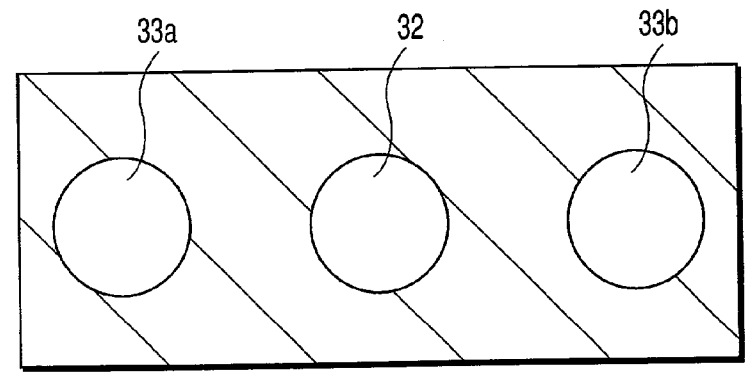

FIGS. 6A to 6C are plan views showing the patterns of photoresist films obtained when the light exposure is changed and the photoresist films are exposed. Since the intensity of the ±1st-order diffracted light is small as compared with the 0th-order diffracted light, as shown in FIG. 6A, the photoresist is completely removed in the 0th-order diffracted light pattern 32, but the photoresist films are not completely removed in the +1st-order and −1st-order diffracted light patterns 33a and 33b.

When the light exposure of FIG. 6A is increased, as shown in FIG. 6B, the photoresist film of the +1st-order diffracted light pattern 33a is completely removed, but the photoresist film of the area irradiated with the −1st-order diffracted light is not completely removed. When the light exposure is further increased, as shown in FIG. 6C, the photoresist films of the +1st-order and −1st-order diffracted light patterns 33a, 33b are completely removed.

For example, a minimum light exposure at which the photoresist film of the +1st-order diffracted light pattern 33a is completely removed is $M_a$, and a minimum light exposure at which the photoresist film of the −1st-order diffracted light pattern 33b is completely removed is $M_b$. Moreover, a light intensity at which the photoresist film is completely removed is obtained from the obtained light exposures $M_a$ and $M_b$. It is considered that the ratio of the light intensity is an inverse number of the ratio of the light exposure. Therefore, the light intensity at which the photoresist is removed by the +1st-order diffracted light is $I_a$, the light intensity at which the photoresist is removed by the −1st-order diffracted light is $I_b$, then $I_a:I_b=1/M_a:1/M_b$. For example, when $M_a:M_b=9:10$, the ratio of the diffracted light intensity is $I_a:I_b=1/9:1/10=10:9$.

With an ideal projection optical system, since the path for passing the +1st-order diffracted light and the path for passing the −1st-order diffracted light have the equal transmittance, and the diffracted light intensities $I_a$ and $I_b$ are equal. On the other hand, when the light passing through the lens materials constituting the projection optical system is scattered, the reflectance of the lens surface is large, or the surface is dirty, the transmittance of the light in the corresponding position drops. As a result, the transmittance possibly fluctuates depending on the light path. The above-described example shows that the +1st-order and −1st-order diffracted lights generated with the same intensity by diffraction in diffraction grating on the photomask pass through the projection optical system via the separate paths having different transmittances, and reach the wafer with an intensity ratio of 10:9. Here, considering that the transmittance of the material is defined by the ratio of the intensity of the emitted light to the incidence light intensity, the ratio of the transmittance of the path of the +1st-order diffracted light to the path of the −1st-order diffracted light is 10:9. As described above, it is possible to check the dependence of the transmittance of the projection optical system on the light path based on the light exposures $M_a$ and $M_b$.

Furthermore, for grating pinholes which have respectively line and space pattern common in the pitch and duty ratio and different in the orientation, and a grating pinhole which has a line and space common in the duty ratio and different in the pitch, the intensity of the ±1st-order diffracted light generated by the pinholes is the same. These pinholes are disposed as the mask pattern in the vicinity, and exposed. In the grating pinhole whose pitch is changed, the path of the ±1st-order diffracted light moves in a radial direction on the pupil plane. On the other hand, in the grating pinhole whose orientation is changed, the path of the ±1st-order diffracted light moves in an angular direction on the pupil plane. Considering from these relations and results obtained from different types of grating pinholes, the state of the fluctuation of transmittance becomes clear with respect to arbitrary the paths of the light which contributes to the imaging in a certain point on the wafer. In this embodiment, the transmittance is measured substantially all paths through which the light reaching imaging point. To know the fluctuation of the transmittance dependent on the light path concerning the imaging in different positions on the wafer, the same grating pinhole group may be disposed and exposed in different positions. For example, FIG. 2 shows the measurement of the position close to the edge of the exposure area, and FIG. 7 shows the measurement in the vicinity of the middle of the exposure area.

Figures 8, 9, 11:
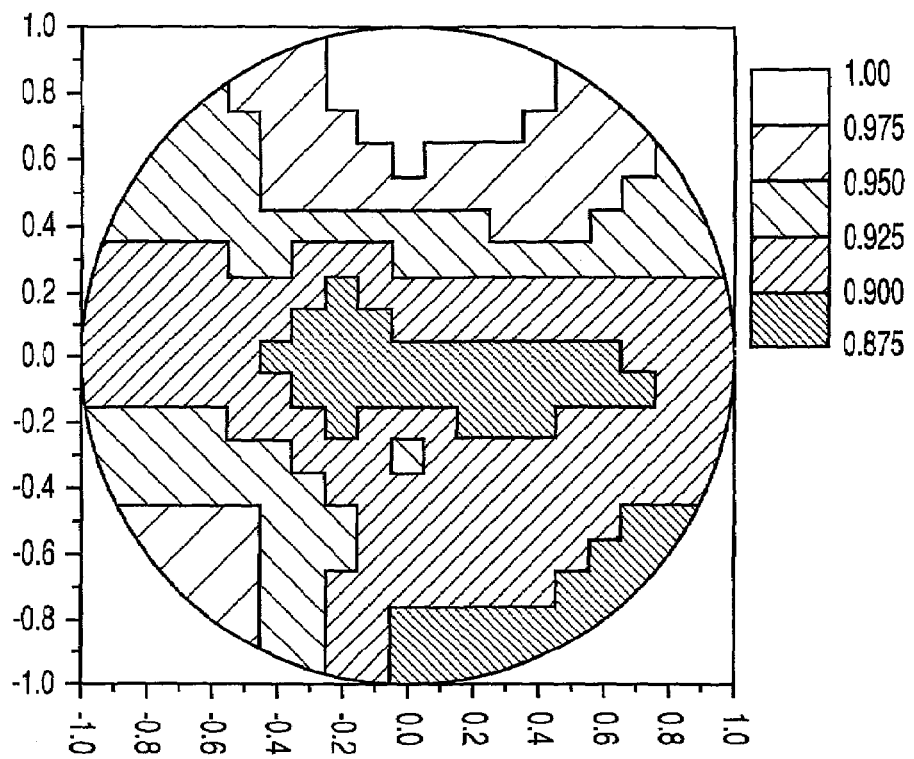
FIG. 8 is a diagram showing one example of a transmittance distribution measured in the pupil plane.
FIG. 9 is a diagram showing a fluctuation of average transmittance in a exposure field.
FIG. 11 is a diagram showing the transmittance distribution in the illuminance unevenness correction filter.

FIG. 8 shows one example of a transmittance distribution in the pupil plane measured using this method. In FIG. 8, for the exposure apparatus as a measuring object, the numerical aperture of the projection optical system is 0.6, and the numerical aperture of the illumination optical system is not less than 0.18 and not more than 0.45. That is, the apparatus has a structure of the partial coherent imaging system.

(Step S102)

Subsequently, an average value of transmittance obtained for the light passed through all points in the pupil plane is calculated in respective transmittance distributions measured in the method with respect to a plurality of points in the exposure field. In other words, the average value of the transmittance having a distribution in the pupil plane is obtained. The average value of the transmittance is obtained with respect to an optional imaging point of the exposure field (finite area) on the exposure substrate. FIG. 9 is a diagram showing the fluctuation of the transmittance average value in the exposure field.

(Step S103)

Subsequently, the illuminance unevenness is calculated from the transmittance average value distribution. When the average value of the transmittance for each imaging point obtained in the step S102 is normalized, the unevenness can be obtained.

(Step S104)

Subsequently, a filter (correction filter) for correcting the illuminance unevenness in the exposure field is prepared based on a calculation result of the illuminance unevenness. For example, the filter is provided in a position that is substantially conjugate with the pattern surface of the photomask.

FIG. 10 is a diagram showing the schematic constitution of the exposure apparatus that has the correction filter with respect to the measured transmittance. As shown in FIG. 10, the illuminating optical system 1 is constituted of arrangement of a light source 900 formed of a laser or a mercury lamp, lens system 901, fly's eye lens 902, diaphragm 903, first lens 904, diaphragm with an optical filter 905, second lens 906, and third lens 907. For the diaphragm with the optical correction filter 905, a diaphragm for limiting the exposure area exists in the surface conjugate with the pattern surface of a reticle 908, and a correction filter 905 for correcting the illuminance unevenness in the exposure field is disposed in the surface. The correction filter 905 has a transmittance distribution that corrects the illuminance unevenness generated by the distribution of the average transmittance of the projection optical system 4 concerning the respective points in the exposure field. That is, as shown in FIG. 11, the filter has a distribution of a inverse ratio of the measured transmittance shown in FIG. 9. FIG. 11 is a diagram showing the transmittance distribution in the illuminance unevenness correction filter.

As the optical filter for correcting the illuminance unevenness, a filter in which opaque materials such as chromium are laminated on a transparent substrate and the distribution of transmittance is given, a liquid crystal panel in which a pattern for changing the transmittance of the light for each place is displayed, and the like are used. The former filter can easily be prepared by a conventional technique for manufacturing the photomask. With the use of the liquid crystal panel, each time the photomask is changed, the illuminance unevenness correction distribution suitable for the mask pattern can freely be given. Therefore, there is an advantage that a trouble of changing the filter can be saved. Of course, any filter may be used as long as the illuminance unevenness can appropriately be corrected.

As a result, the light intensity with which the substrate is irradiated in the transfer of the fine pattern is uniformed, and the device pattern is normally projected to form the image.

The action/effect of the first embodiment will be described hereinafter. When the photomask is not disposed or a relatively large-sized pattern is exposed, the path of the light passing through the projection optical system is only a light path passing in the vicinity of the middle (the vicinity of the optical axis) of the pupil plane of the projection optical system. On the other hand, when the fine device pattern having a size of not more than an exposure wavelength is projected/exposed, the light path tends to expand to the vicinity of the edge of the pupil plane of the projection optical system. In general, the light emitted from the photomask passes through the projection optical system constituted of a plurality of lenses via various paths, and is collected onto the photosensitive substrate. The length passing through the lens material or the incidence angle onto the lens surface differs depending on the path. When the light is reflected or scattered, the intensity of the exposure light is attenuated. However, since the reflecting/scattering depends on the lens material pass length and the incidence angle to the lens surface, the light attenuation differs depending on the light path. In other words, the transmittance of the projection optical system differs depending on the light path. Particularly, a lens thickness differs with the center and edge of the pupil plane, or the incidence angle of the light incident upon the lens surface differs, and therefore there is a possibility that the transmittance largely differs between the light path extending in the vicinity of the middle of the pupil plane of the projection optical system and the light path in the vicinity of the edge of the pupil plane.

Therefore, when the light passing in the vicinity of the optical axis is measured and the illuminance unevenness is corrected as in the conventional method, the illuminance unevenness is suppressed during the exposure of the pattern of which size is relatively large. However, for the fine pattern projected to form the image using the light passing through the edge of the pupil plane of the projection optical system, the illuminance unevenness is possibly not appropriately corrected.

To solve the problem, the first embodiment includes: measuring the change of the transmittance dependent on the light path of the projection optical system; calculating the average transmittance from the measured transmittance; obtaining the average transmittance of a plurality of points in the exposure field on the wafer and calculating the illuminance unevenness; and correcting the illuminance unevenness from obtained illuminance unevenness data and exposing/transferring the fine device pattern, so that the illuminance unevenness can appropriately be suppressed even during the projection/exposure of not only the large pattern but also the fine pattern.

Additionally, for the photomask for use in the first embodiment, the area other than the grating pinhole pattern is shielded, that is, the photomask having a high coverage is used. In this case, a amount of flare is small. Therefore, an accurate correction value is obtained for the photomask having the high coverage. If the illuminance unevenness is corrected during the use of a photomask having a low coverage, in the photomask for use, a transmission area is disposed apart from a measurement pattern not to interfere with the pattern, and thereby the photomask for measuring the transmittance has the similar coverage. Then, an appropriate illuminance unevenness correction value is obtained.

According to the first embodiment, the illuminance unevenness is measured in consideration of the influence of the light passing through the edge area of the pupil plane, and this which has not been measured in the conventional method. When the illuminance unevenness is corrected based on the measurement, it is possible to appropriately correct the illuminance unevenness generated during an actual device pattern transfer.

In a modification example of the method, the average value concerning an optional partial area in the pupil plane may be calculated instead of obtaining the average value of the transmittance of the whole pupil plane. When the illuminance unevenness is corrected based on the calculated average value, the substantial illuminance unevenness in the transfer of the specific pattern can be suppressed with a good precision.

Figure 12:
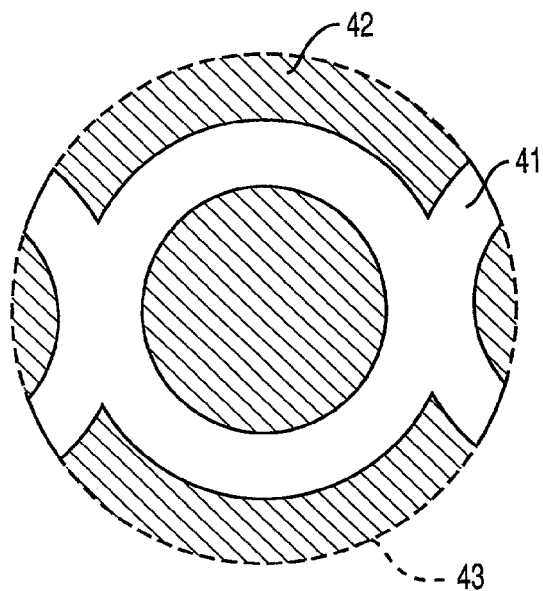
FIG. 12 is a plan view showing a diffracted light distribution in the pupil plane with use of a annular illumination.
Figure 13:
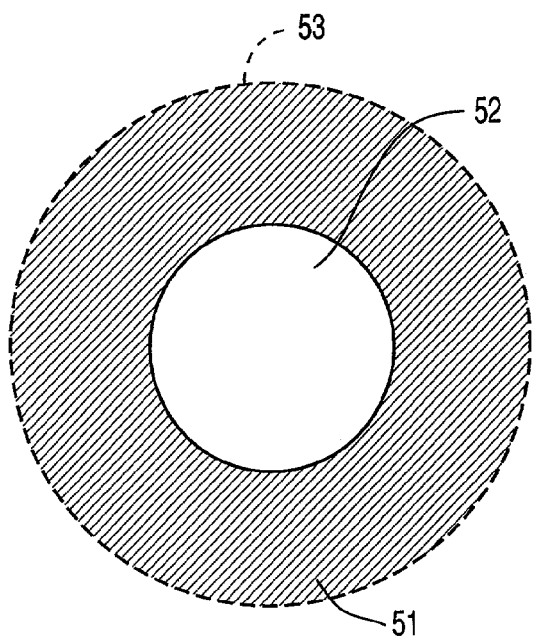
FIG. 13 is a plan view showing a area in which transmittance is measured, to show the diffracted distribution shown in FIG. 12.

An example in which a annular illumination is used to transfer the fine line and space pattern will be described. FIG. 12 is a plan view showing a diffracted light distribution in the pupil plane with use of the annular illumination. In FIG. 12, reference numeral 41 denotes a diffracted light pass area in which the diffracted light passes, numeral 42 denotes a diffracted light non-pass area in which the diffracted light does not pass, and numeral 43 denotes the peripheral of the pupil plane. As shown in FIG. 12, the diffracted light does not pass in the vicinity of the middle of the lens, and passes only in the vicinity of the edge of the lens. Therefore, as shown in FIG. 13, the average value of the transmittance of a area 51 including the pass area of the diffracted light is obtained, the illuminance unevenness is corrected based on the value, and the average value of the transmittance of the area 52 may not be obtained. Additionally, in FIG. 13, numeral 53 denotes the edge of the pupil plane.

The measuring of the distribution of the transmittance dependent on the light path performed in the first embodiment is not limited to the method disclosed in Jpn. Pat. Appln. No. 2000-36990, and the unevenness may be corrected based on the value obtained by measuring the distribution of the transmittance dependent on the light path in another method. For example, a light receiving element may be disposed in the surface conjugate with the pupil plane below the photosensitive substrate surface of the exposure apparatus in order to measure the distribution. Another method may include: obtaining the distribution of the transmittance of each constituting lens; and obtaining a product of the transmittance with respect to all the lenses before the projection optical system is assembled. The transmittance dependent on the light path may be obtained in this manner.

(Second Embodiment)

In the first embodiment, the average of the transmittance of the light passing through the whole pupil plane is calculated, and the illuminance unevenness correction value in a certain imaging point on the wafer surface is calculated. This method is developed on the assumption that the influence of the transmittance of the light path (the whole path, or only the light passing light path) extending to the imaging point onto the imaging is constant irrespective of the light path. In this case, it is assumed that all the light paths for the transfer have a uniform influence on the imaging. When the illuminance unevenness is corrected in this way of thinking, the illuminance unevenness can effective be corrected with respect to any shape of pattern.

On the other hand, the illuminance unevenness can also be corrected more appropriately with respect to a specific pattern. For example, a pattern having a minimum exposure dose margin (generally a pattern having a finest pitch) is noted among the photomasks for actually transferring the device pattern, and the illuminance concerning the pattern transfer is corrected to be uniform. Then, the transfer of the photomask can be facilitated. The principle is as follows.

In general, the light which contributes to the imaging is sometimes a light which has a different intensity for each path. In other words, like the 0th-order diffracted light and 1st-order diffracted light generated during the exposure of the line and space pattern, the intensity of the light passing through a certain path is large, and the intensity of the light passing through another path is small. In this case, the transmittance of the path through which the high-intensity light passes mainly determines the illuminance, and the transmittance of the path through which the low-intensity light passes contributes a little to the illuminance. For example, with the line and space pattern whose ratio of the width of the line to that of the space is 1:1, the 0-order diffracted light has a highest intensity, and the intensity of the ±1st-order diffracted light is about 40% of that of the 0th-order diffracted light. For example, here, a drop of the transmittance of the path of the 0th-order diffracted light by a % in a certain imaging point A, and a drop of the transmittance of the path of the +1st-order diffracted light by a % in another imaging point B are considered. The difference of the diffracted light intensity is considered, and a illuminance drop in the imaging point A is 1, then the illuminance drop in the imaging point B is 0.4.

In this case, the transmittance is weighted in accordance with the intensity of the light, the average of the transmittance is calculated, and the correction value of the illuminance unevenness is calculated. That is, a weighting factor of the transmittance of the 0th-order diffracted light path is set to 1, a weighting factor of the transmittance of the 1st-order diffracted light path is set to 0.4, and the illuminance unevenness correction value may be calculated in such a manner the line and space pattern is irradiated in all the imaging points with a uniform illuminance.

One example of the calculating method of the illuminance unevenness correction value using the weighting will be described. When an incidence light intensity in a position (X, Y) on the pupil plane is I(X, Y), an effective illuminance D(x, y) in the imaging point (x, y) on the corresponding wafer is defined in the following equation.

$$D(x, y) = \int T(X, Y) \cdot I(X, Y) dX dY \quad \text{(Equation 1)}$$

Here, T(X, Y) denotes the transmittance of the path extending to the imaging point (x, y) through the point (X, Y) on the pupil plane, and is a value obtained, for example, in the method described in the first embodiment. Moreover, it is assumed that an integration area is a whole pupil plane. Moreover, the correction value of the illuminance unevenness is constant times the reciprocal number (1/D(x, y)) of the effective illuminance.

A concrete example will next be described. It is assumed that the exposure apparatus having an exposure wavelength of 193 nm is used to transfer a 130 nm line and space pattern with the ratio of the line to the space of 1:1 on optical conditions of NA=0.6, σ=0.75, and ⅔ annular illumination. A photomask for use is a mask attenuated phase shift mask (the intensity transmittance of a translucent portion is 6%, and a phase difference is 180°). In this case, the dependence of the intensity (I(X, Y)) of the diffracted light incident upon the projection lens on the path is represented by the intensity distribution on the pupil plane as shown in FIG. 14. It is derived from the theory of Fraunhofer diffraction that a ratio of intensity $I_0$ of the 0th-order diffracted light to intensity $I_1$ of the 1st-order diffracted light is approximately 7:9.

As shown in FIG. 14, the light intensity distribution in the pupil plane is divided into four areas:

1) area 1301 through which the 0th-order diffracted light passes;

2) area 1302 through which the 1st-order diffracted light passes;

3) area 1303 through which the 0th-order and 1st-order diffracted lights pass; and 4) area 1304 through which no diffracted light passes.

The values of the intensity I(X, Y) in the respective areas 1301 to 1304 are $I_0$, $I_1$, $(I_0+I_1)$, 0. When these intensities and a function T(X, Y) indicating the transmittance fluctuation dependent on the light path separately obtained using, for example, the method described in the first embodiment are used to calculate the equation 1, the illuminance unevenness correction value is calculated. When the correction value is used to correct the illuminance unevenness, the illuminance in the exposure area on the wafer surface becomes uniform with respect to the transfer of the line and space pattern.

(Third Embodiment)

A diffraction pattern is disposed on the photomask surface. The diffraction pattern includes a diffraction grating, and concrete examples of the diffraction pattern include a simple periodic pattern such as the line and space pattern, a two-dimensional periodic pattern for actual use in a semiconductor device pattern, and the like. Additionally, the pattern is uniformly periodic in a circular area having a radius of about 10 μm (scale on the wafer) and a broader area. The whole uniformly periodic area is called one "diffraction pattern". Pluralities of diffraction patterns are arranged across exposure field in a scattered manner. Here, the inner configuration of each diffraction pattern is the same.

FIG. 15A is a plan view showing the schematic configuration of the photomask, and FIG. 15B is a diagram showing the configuration of the diffraction pattern present on the photomask surface. FIGS. 15A and 15B show the examples of the photomasks which satisfy the above-described conditions. As shown in FIG. 15A, seven diffraction patterns 1403 are formed in a exposure field 1402 of a photomask 1401. The diffraction pattern 1403 has each side of 500 μm. For the diffraction pattern 1403, as shown in FIG. 15B, square grating patterns 1405 are used as the diffraction grating. A square grating patterns 1405 are arranged such that one half of a pitch of the pattern in longitudinal or lateral is 0.15 μm. Here, numeral 1404 denotes a shield area.

Figure 16:
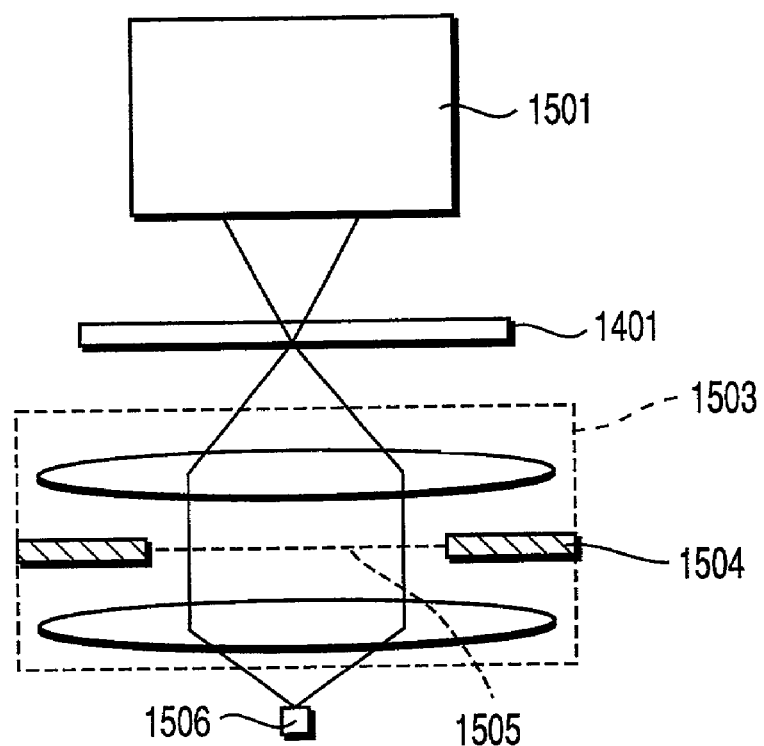
FIG. 16 is a diagram showing the schematic constitution of the exposure apparatus using the photomask shown in FIGS. 15A and 15B.

FIG. 16 is a diagram showing the schematic constitution of the exposure apparatus using the photomask 1401. In FIG. 16, numeral 1501 denotes an illuminating optical system, numeral 1503 denotes a projection optical system, numeral 1504 denotes an aperture diaphragm, numeral 1505 denotes a pupil plane, and numeral 1506 denotes an illuminance meter.

As shown in FIG. 16, the illuminance meter 1506 for measuring the illuminance is disposed on the wafer surface. The illuminance meter 1506 can move in an optional position in the exposure field, and measures the illuminance in a position corresponding to the wafer surface. Moreover, the illuminance meter 1506 has an effective measurement range of a circle with a size of about several microns or any other optional shape having substantially the same area. Moreover, the illuminance meter 1506 has a low resolution to such an extent that the diffraction pattern on the photomask cannot be resolved. In other words, it is assumed that the meter 1506 has a function of measuring an average illuminance in the effective measurement range. As shown in FIG. 16, the projection/exposure is performed while the pattern surface of the photomask 1401 is conjugate with the photosensitive surface of the illuminance meter 1506. Moreover, the illuminance meter 1506 is disposed in a position onto which the image of the diffraction pattern (not shown) is transferred, and the illuminance is measured. The plurality of the diffraction patterns present in the exposure field are subjected to similar measurement, and measurement results are brought together and used as an illuminance unevenness measured value in the exposure field.

In the third embodiment, during the transfer of the diffraction grating, the illuminance unevenness caused by the fluctuation of the transmittance in the light path through which the diffracted light passes can be measured. Therefore, when the illuminance unevenness is corrected based on the measured value, the illuminance unevenness peculiar to the pattern transfer can be reduced. For example, with the semiconductor device pattern that requires a much-advanced type of illuminance adjustment, the illuminance unevenness peculiar to a light flux for use in forming the image of the pattern is measured and corrected according to the method of the third embodiment. Then, an illuminance distribution characteristic can be realized such that the device pattern is satisfactorily transferred.

The diffraction grating for use in the third embodiment may be a binary diffraction grating, a phase shift type diffraction grating, or any other diffraction grating. It has been described above that an area of the diffraction pattern has a circular shape with a radius of 10 $\mu$m, substantially the same area, or a broader area, but the size of the pattern is not limited to this, and any size may be used as long as the area is broader than the effective measurement range of the illuminance meter.

Moreover, in the third embodiment, the illuminance meter is used to measure the illuminance on the wafer surface, but the mechanism for measuring the illuminance is not necessarily limited to this, and optional photosensitive materials such as the photoresist may be used to measure the brightness. In this case, it is possible to obtain the illuminance from a relation between the exposure dose and the photoresist remaining film thickness.

As compared with the method of the first embodiment, in the method of the third embodiment, it is advantageously possible to more easily measure the illuminance unevenness in which the fluctuation of the transmittance only of the light path directly related with the imaging of the measurement pattern is reflected.

(Fourth Embodiment)

During the manufacturing of the semiconductor device pattern, various shapes such as a periodic pattern, isolated pattern are drawn on the photomask for use in the lithography process. The tolerance of the light exposure differs depending on the periodicity, size, and shape of the pattern in the transfer of each pattern. In other words, there are patterns which are or are not susceptible to the influence of the illuminance unevenness in the exposure area. In general, a finer pattern is easily influenced by the illuminance unevenness. To enhance the yield of the semiconductor device, the illuminance needs to be uniformed in the exposure area. The illuminance is preferably uniform with respect to the pattern exposure which is most easily influenced by the illuminance unevenness.

Figure 17:
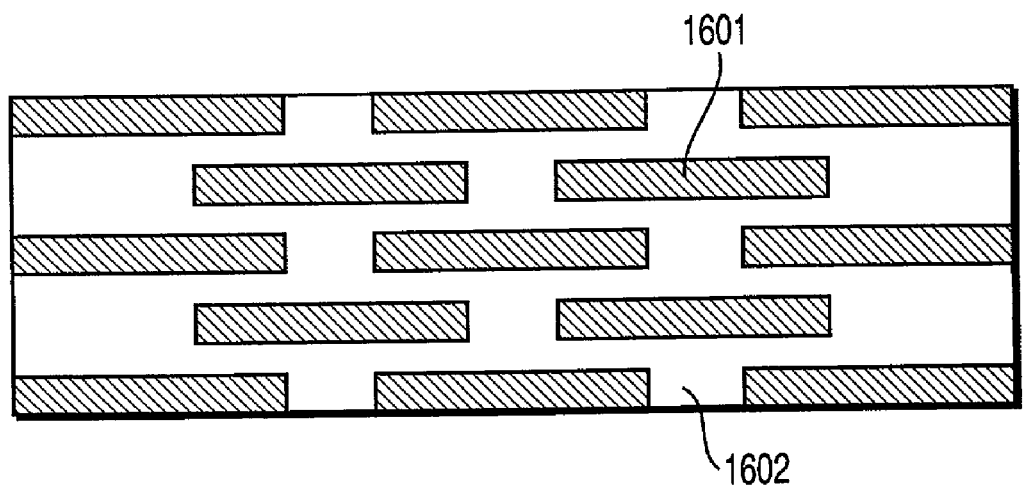
FIG. 17 is a plan view showing an example of a periodic pattern according to a fourth embodiment.

In a memory cell pattern area of the photomask for use in manufacturing the DRAM, a fine periodic pattern constituted of opaque portions 1601 and transmission portions 1602 exist, such as a shallow trench isolation pattern shown in FIG. 17. The periodic pattern shown in FIG. 17 is finest among the periodic patterns existed in the photomasks, and has a smallest exposure dose margin estimated from optical image simulation. The correction value is calculated using the method described in the third embodiment, so that the illuminance concerning the pattern transfer is uniformed. The filter having a transmittance distribution for correcting the illuminance unevenness by the obtained correction value is disposed in a direction vertical to the optical axis in the surface conjugate with the mask pattern surface, such as the vicinity of the surface in which the diaphragm for limiting the exposure area exists, in the illuminating optical system of the exposure apparatus. After the illuminance unevenness is corrected, the photomask is exposed, and the photomask including the memory cell area is transferred. As a result, the DRAM can be manufactured with a higher yield as compared with a case in which the illuminance unevenness is not corrected. Examples of the filter for correcting the illuminance unevenness include the filter which the opaque materials such as chromium are laminated on the transparent substrate and the distribution of the transmittance is given, the liquid crystal panel for displaying the pattern whose transmittance of the light is changed for each position as described in the first embodiment, and other materials which can appropriately correct the illuminance unevenness.

Additionally, the present invention is not limited to the above-described embodiments. For example, as described above, the correction filter is disposed in the surface in which the diaphragm for limiting the exposure area exists, but this is not limited. The lenses are added into the light path, and appropriately combined, thereby another surface conjugate with the pattern surface of the photomask is formed, and the filter may be disposed in the surface.

Moreover, the present invention can variously be modified and implemented without departing from the scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A measuring method of an illuminance unevenness of an exposure apparatus in which the illuminance unevenness generated in a finite area on a photosensitive substrate is measured with respect to the exposure apparatus to irradiate a photomask with an illumination light emitted from an illuminating optical system, to project the light passed through the photomask onto the finite area on the photosensitive substrate via the projection optical system and to expose the photomask to the light, said method comprising:

measuring a transmittance of said projection optical system of the light emitted from one point, which is optically conjugate with an imaging point, on said photomask, traveling inside said projection optical system and reaching said imaging point for each of a plurality of imaging points in the finite area on said photosensitive substrate;

calculating an average value of the transmittance of the light emitted from said one point, traveling inside said projection optical system and converging on said imaging point about a plurality of paths inside said projection optical system for each of a plurality of imaging points in the finite area on said photosensitive substrate; and calculating the illuminance unevenness in the finite area on said photosensitive substrate from a distribution of said average values of the transmittance obtained for said each imaging point.

2. The measuring method of the illuminance unevenness of the exposure apparatus according to claim 1, further comprising:

exposing a photomask for check in which a diffraction grating pattern having a transmission portion and a opaque portion repeated in a predetermined direction in a finite pitch and including a transmission pattern having a periphery thereof shielded by a shield area is formed by an optical member, and which is not conjugate with said photosensitive substrate with respect to said projection optical system;

projecting a diffracted light passed through said photomask for check onto a wafer via said projection optical system and forming a measurement pattern in which an intensity of said diffracted light is reflected; and measuring a transmittance distribution of the projection optical system based on said measurement pattern image transferred onto said wafer in the form of a function of a path of the light related with the optional imaging point.

3. The measuring method of the illuminance unevenness of the exposure apparatus according to claim 2, wherein assuming that a numerical aperture on said photosensitive substrate side of said projection optical system is NA, a coherence factor of said exposure apparatus is $\sigma$, an exposure wavelength is $\lambda$, and a magnification of said photomask for measurement is M, a pitch of said diffraction grating pattern satisfies $p > M\lambda/NA(1+\sigma)$.

4. The measuring method of the illuminance unevenness of the exposure apparatus according to claim 1, further comprising: calculating the average value of the transmittance of said projection optical system from transmittance of substantially all paths through which the light reaching said imaging point.

5. The measuring method of the illuminance unevenness of the exposure apparatus according to claim 1, further comprising: calculating the average value of the transmittance of said projection optical system from transmittance of some of paths through which the light reaching said imaging point passes.

6. The measuring method of the illuminance unevenness of the exposure apparatus according to claim 1, wherein the average value of the transmittance of said projection optical system is a weighted average calculated by weighting each path with respect to an optional path through which the light related with imaging of said optional one point passes.

7. An exposure apparatus comprising: a correcting mechanism which is disposed in an illuminating optical system and which corrects illuminance unevenness in a finite area based on the illuminance unevenness measured using the measuring method of the illuminance unevenness of the exposure apparatus according to claim 1.

8. The exposure apparatus according to claim 7, wherein said correcting mechanism includes a liquid crystal panel.

9. The exposure apparatus according to claim 7, wherein said correcting mechanism includes an optical member in which opaque films are laminated on a transparent substrate, and a distribution of transmittance is provided.

10. A measuring method of an illuminance unevenness of an exposure apparatus in which the illuminance unevenness generated in a finite area on a photosensitive substrate is measured in the exposure apparatus to irradiate a photomask having a light transmission pattern formed thereon with an illumination light emitted from an illuminating optical system, to project the light passed through the photomask via a projection optical system, and to transfer a pattern analogous to said light transmission pattern onto the finite area on the photosensitive substrate, said method comprising:

disposing a plurality of diffraction patterns having a uniform periodicity in a predetermined area in said photomask;

disposing an illuminance measuring mechanism to measure illuminance of an optional point on the surface of said photosensitive substrate;

irradiating said diffraction pattern with the light from said illuminating optical system, and using said illuminance measuring mechanism to measure the illuminance in a position of an image formed by said diffraction pattern in said photosensitive substrate surface; and calculating an illuminance distribution in the finite area of said photosensitive substrate in a form related to both a position of an optical imaging point and incidence direction of the light.

11. A correcting method of an illuminance unevenness of an exposure apparatus in which the illuminance unevenness generated in a finite area on a photosensitive substrate is corrected with respect to the exposure apparatus to irradiate a photomask with an illumination light emitted from an illuminating optical system, to project the light passed through the photomask onto the finite area on the photosensitive substrate via the projection optical system and to expose the photomask to the light, said method comprising:

measuring a transmittance of said projection optical system of the light emitted from one point, which is optically conjugate with an imaging point, on said photomask, traveling inside said projection optical system and reaching said imaging point for each of a plurality of imaging points in the finite area on said photosensitive substrate;

calculating an average value of the transmittance of the light emitted from said one point, traveling inside said projection optical system and converging on said imaging point about a plurality of paths inside said projection optical system for each of a plurality of imaging points in the finite area on said photosensitive substrate;

calculating the illuminance unevenness in the finite area on said photosensitive substrate from a distribution of said average values of the transmittance obtained for said each imaging point; and correcting the illuminance unevenness based on the illuminance unevenness in the finite area of said photosensitive substrate.

12. The correcting method of illuminance unevenness of an exposure apparatus according to claim 11, further comprising:

exposing a photomask for check in which a diffraction grating pattern having a transmission portion and a opaque portion repeated in a predetermined direction in a finite pitch and including a transmission pattern having a periphery thereof shielded by a shield area is formed by an optical member, and which is not conjugate with said photosensitive substrate with respect to said projection optical system;

projecting a diffracted light passed through said photomask for check onto a wafer via said projection optical system and forming a measurement pattern in which an intensity of said diffracted light is reflected; and measuring a transmittance distribution of the projection optical system based on said measurement pattern image transferred onto said wafer in the form of a function of a path of the light related with the optional imaging point.

13. The correcting method of illuminance unevenness of an exposure apparatus according to claim 12, wherein assuming that a numerical aperture on said photosensitive substrate side of said projection optical system is NA, a coherence factor of said exposure apparatus is $\sigma$, an exposure wavelength is $\lambda$, and a magnification of said photomask for measurement is M, a pitch of said diffraction grating pattern satisfies $p > M\lambda/NA(1+\sigma)$.

14. The correcting method of illuminance unevenness of an exposure apparatus according to claim 11, further comprising: calculating the average value of the transmittance of said projection optical system from transmittance of substantially all paths through which the light reaching said imaging point.

15. The correcting method of illuminance unevenness of an exposure apparatus according to claim 11, further comprising: calculating the average value of the transmittance of said projection optical system from transmittance of some of paths through which the light reaching said imaging point passes.

16. The correcting method of illuminance unevenness of an exposure apparatus according to claim 11, wherein the average value of the transmittance of said projection optical system is a weighted average calculated by weighting each path with respect to an optional path through which the light related with imaging of said optional one point passes.

17. A manufacturing method of a semiconductor device, comprising: using an exposure apparatus subjected to correction of illuminance unevenness according to the method of claim 11.

18. A correcting method of an illuminance unevenness of an exposure apparatus in which the illuminance unevenness generated in a finite area on a photosensitive substrate is corrected in the exposure apparatus to irradiate a photomask having a light transmission pattern formed thereon with an illumination light emitted from an illuminating optical system, to project the light passed through the photomask via a projection optical system, and to transfer a pattern analogous to said light transmission pattern onto the finite area on the photosensitive substrate, said method comprising:

disposing a plurality of diffraction patterns having a uniform periodicity in a predetermined area in said photomask;

disposing an illuminance measuring mechanism to measure illuminance of an optional point on the surface of said photosensitive substrate;

irradiating said diffraction pattern with the light from said illuminating optical system, and using said illuminance measuring mechanism to measure the illuminance in a position of an image formed by said diffraction pattern in said photosensitive substrate surface;

calculating an illuminance distribution in the finite area of said photosensitive substrate in a form related to both a position of an optical imaging point and incidence direction of the light; and correcting the illuminance unevenness based on the illuminance unevenness in the finite area of said photosensitive substrate.

19. A manufacturing method of a semiconductor device, comprising: using an exposure apparatus subjected to correction of illuminance unevenness according to the method of claim 18.

20. The manufacturing method of the semiconductor device according to claim 16, wherein the diffraction pattern according to claim 18 has the same shape as that of any one of periodic patterns included in said photomask for use in manufacturing the semiconductor device.

* * * * *